(12) United States Patent
Kim et al.

(10) Patent No.: US 8,920,563 B2
(45) Date of Patent: Dec. 30, 2014

(54) THIN FILM DEPOSITION APPARATUS AND METHOD OF MANUFACTURING ORGANIC LIGHT-EMITTING DISPLAY DEVICE BY USING THE SAME

(75) Inventors: Mu-Gyeom Kim, Yongin (KR); Chang-Mo Park, Yongin (KR)

(73) Assignee: Samsung Display Co., Ltd. (KR)

( * ) Notice: Subject to any disclaimer, the term of this patent is extended or adjusted under 35 U.S.C. 154(b) by 98 days.

(21) Appl. No.: 13/225,992

(22) Filed: Sep. 6, 2011

(65) Prior Publication Data

US 2012/0156818 A1    Jun. 21, 2012

(30) Foreign Application Priority Data

Dec. 15, 2010   (KR) .................. 10-2010-0128617

(51) Int. Cl.
| | | |
|---|---|---|
| C23C 16/00 | (2006.01) | |
| C23C 16/50 | (2006.01) | |
| C23F 1/00 | (2006.01) | |
| H01L 21/306 | (2006.01) | |
| C23C 14/04 | (2006.01) | |
| C23C 14/56 | (2006.01) | |
| H01L 51/00 | (2006.01) | |

(52) U.S. Cl.
CPC ............ *C23C 14/562* (2013.01); *C23C 14/042* (2013.01); *H01L 2251/105* (2013.01); *H01L 51/0011* (2013.01)
USPC ......................................... 118/721; 156/345.3

(58) Field of Classification Search
USPC ............... 118/211, 212, 720, 721; 156/345.1, 156/345.11, 345.19, 345.3; 216/41–51
See application file for complete search history.

(56) References Cited

U.S. PATENT DOCUMENTS

| | | | |
|---|---|---|---|
| 2002/0076847 A1 | 6/2002 | Yamada et al. | |
| 2003/0232563 A1 | 12/2003 | Kamiyama et al. | |
| 2006/0251803 A1* | 11/2006 | Huizinga et al. | ............. 427/162 |
| 2007/0218258 A1* | 9/2007 | Nees et al. | ................... 428/209 |

FOREIGN PATENT DOCUMENTS

| | | |
|---|---|---|
| JP | 3125279 | 9/1992 |
| JP | 09283279 | 10/1997 |
| JP | 4187367 | 4/2001 |
| JP | 2001093667 | 4/2001 |
| JP | 2001232251 | 8/2001 |
| JP | 2002175878 | 6/2002 |
| JP | 2003077662 | 3/2003 |
| JP | 2003157973 | 5/2003 |
| JP | 2003297562 | 10/2003 |
| JP | 2004103341 | 4/2004 |
| JP | 2004272170 | 9/2004 |
| JP | 3705237 | 8/2005 |

* cited by examiner

*Primary Examiner* — Maureen Gramaglia
*Assistant Examiner* — Tiffany Nuckols
(74) *Attorney, Agent, or Firm* — Knobbe Martens Olson & Bear LLP

(57) ABSTRACT

A thin film deposition apparatus that may be easily manufactured, that may be easily applied to manufacture large-sized display devices on a mass scale, and that improves manufacturing yield and deposition efficiency, and a method of manufacturing an organic light-emitting display device by using the thin film deposition apparatus are disclosed. The thin film deposition apparatus for forming a thin film on a substrate, the thin film deposition apparatus including: a magnet disposed on a first surface of the substrate; a patterning wheel disposed on a second surface opposite to the first surface of the substrate, rotatable around a rotation axis, and including a plurality of grooves along a peripheral surface; and a patterning wire including a plurality of blockers having shapes corresponding to the plurality of grooves of the patterning wheel, and windable to the patterning wheel.

17 Claims, 9 Drawing Sheets ically difficult to form fine patterns in organic thin films such as the emission layer and the intermediate layers, and red, green, and blue light-emission efficiency varies according to the organic thin films. For these reasons, it is not typically easy to form an organic thin film pattern on a large substrate, such as a mother glass having a size of 5 G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a demand for improvement in this regard.

THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATIONS

This application claims the benefit of Korean Patent Application No. 10-2010-0128617, filed on Dec. 15, 2010, in the Korean Intellectual Property Office, the disclosure of which is incorporated herein in its entirety by reference.

BACKGROUND

1. Field

The disclosure relates to a thin film deposition apparatus and a method of manufacturing an organic light-emitting display device by using the same, and more particularly, to a thin film deposition apparatus that is easily applied to the manufacture of large-sized display devices on a mass scale and that improves manufacturing yield, and a method of manufacturing an organic light-emitting display device by using the thin film deposition apparatus.

2. Description of the Related Technology

Organic light-emitting display devices have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode, so that the organic light-emitting display devices display images in color when holes and electrons, injected respectively from the anode and the cathode, recombine in the emission layer and thus light is emitted. However, it is difficult to achieve high light-emission efficiency with such a structure, and thus intermediate layers, including an electron injection layer, an electron transport layer, a hole transport layer, a hole injection layer, and the like, are optionally additionally interposed between the emission layer and each of the electrodes.

Also, it is practically difficult to form fine patterns in organic thin films such as the emission layer and the intermediate layers, and red, green, and blue light-emission efficiency varies according to the organic thin films. For these reasons, it is not typically easy to form an organic thin film pattern on a large substrate, such as a mother glass having a size of 5 G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a demand for improvement in this regard.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured using the deposition method, a fine metal mask (FMM) having the same pattern as a thin film to be formed is disposed to closely contact a substrate, and a thin film material is deposited over the FMM in order to form the thin film having the desired pattern.

SUMMARY OF CERTAIN INVENTIVE ASPECTS

Embodiments provide a thin film deposition apparatus that may be easily manufactured, that may be easily applied to manufacture large-sized display devices on a mass scale, and that improves manufacturing yield and deposition efficiency, and a method of manufacturing an organic light-emitting display device by using the thin film deposition apparatus.

According to one aspect, there is provided a thin film deposition apparatus for forming a thin film on a substrate, the thin film deposition apparatus including: a magnet disposed on a first surface of the substrate; a patterning wheel disposed on a second surface opposite to the first surface of the substrate, rotatable around a rotation axis, and comprising a plurality of grooves along a peripheral surface; and a patterning wire comprising a plurality of blockers having shapes corresponding to the plurality of grooves of the patterning wheel, and windable to the patterning wheel.

The patterning wire may include two frame wires disposed to face each other, and the plurality of blockers connecting the two frame wires.

A predetermined patterning space may be formed between neighboring blockers of the plurality of blockers, while the patterning wire may be tightly coupled to the substrate.

A deposition material may be deposited on the second surface of the substrate through the patterning space.

The plurality of grooves and the plurality of blockers may have substantially the same shapes and may be disposed at regular intervals.

Each of the plurality of blockers may be accommodated in each of the plurality of grooves when the patterning wire is wound around the patterning wheel.

An interval between neighboring grooves of the plurality of grooves, and an interval between neighboring blockers of the plurality of blockers may be substantially the same.

Cross sections of the plurality of grooves and the plurality of blockers may be triangular.

The patterning wire may include a magnetic substance, and the patterning wire may be tightly coupled to the second surface of the substrate according to a magnetic force acting between the magnet and the patterning wire.

The magnetic substance may include at least of copper (Co), platinum (Pt), iron (Fe), nickel (Ni), and lanthanum (La).

The patterning wheel may include at least one of a permanent magnet and an electromagnet, and the patterning wire may maintain a wound state around the patterning wheel by a magnetic force acting between the patterning wheel and the patterning wire.

The magnet may be formed to have a magnetic force stronger than the patterning wheel.

The patterning wire may be accommodated in the plurality of blockers, and may further include a core including a magnetic substance.

The thin film deposition apparatus may further include a pressurizer disposed on the patterning wheel at a side opposite to the substrate, having a roller shape, and pressurizing each of the plurality of blockers so that each of the plurality of blockers is matched to each of the plurality of grooves.

The thin film deposition apparatus may further include a rotatable alignment wheel of a cylindrical shape, including a plurality of protrusions along a peripheral surface of the alignment wheel, disposed at one side of the patterning wheel, and pressurizing the plurality of blockers so that a location of the patterning wire tightly coupled to the substrate is aligned.

The patterning wire may be unwound from the patterning wheel and tightly coupled to the substrate to form a mask for deposition.

The patterning wire wound around the patterning wheel may be unwound and tightly coupled to the substrate as the substrate relatively moves with respect to the patterning wheel and the patterning wheel rotates based on the rotation axis.

According to another aspect, there is provided a method of manufacturing an organic light-emitting display device, the method including: preparing a patterning wheel having a peripheral surface wound by a patterning wire; rectilinearly moving a substrate while rotating the patterning wheel around a rotation axis; tightly coupling the patterning wire to the substrate as the patterning wire wound around the patterning wheel is unwound when the patterning wheel rotates; and depositing an organic material on the substrate by using the patterning wire tightly coupled to the substrate as a mask.

A magnet may be disposed on the substrate, the patterning wire may include a magnetic substance, and the patterning wire wound to the patterning wheel may be tightly coupled to the substrate after being unwound by a magnetic force acting between the magnet and the patterning wire.

The rectilinearly moving of the substrate and the rotating of the patterning wheel may be performed at the same speed.

The patterning wire may include two frame wires disposed to face each other, and a plurality of blockers connecting the two frame wires, and a predetermined patterning space may be formed between neighboring blockers of the plurality of blockers while the patterning wire is tightly coupled to the substrate.

A second organic material may be deposited after a first organic material is deposited while the patterning wire is tightly coupled to the substrate, and then the patterning wire tightly coupled to the substrate may be moved by a predetermined interval in parallel.

The predetermined interval may be ⅓ of a width of one of the plurality of blockers in a moving direction of the substrate.

BRIEF DESCRIPTION OF THE DRAWINGS

The above and other features and advantages will become more apparent by describing in detail certain embodiments with reference to the attached drawings in which.

DETAILED DESCRIPTION OF CERTAIN INVENTIVE EMBODIMENTS

Hereinafter, the present invention will be described more fully with reference to the accompanying drawings, in which certain embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
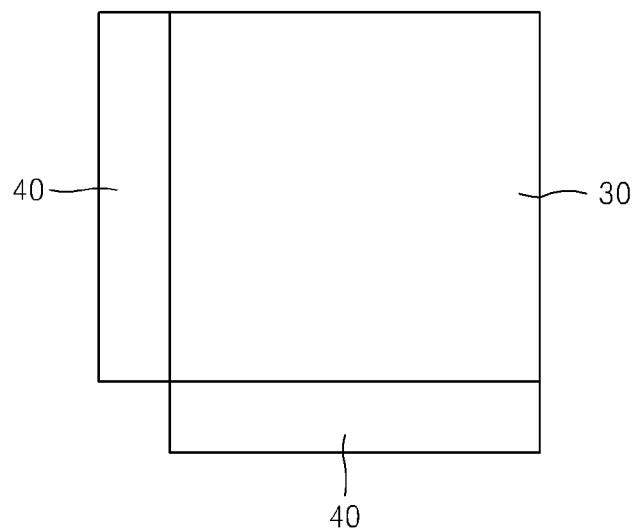
FIG. 1 is a plan view of an embodiment of an organic light-emitting display device manufactured by using a thin film deposition apparatus.

FIG. 1 is a plan view of an embodiment of an organic light-emitting display device manufactured by using a thin film deposition apparatus.

Referring to FIG. 1, an embodiment of the organic light-emitting display device includes a pixel region 30 and circuit regions 40 disposed at edges of the pixel region 30. The pixel region 30 includes a plurality of pixels, and each of the pixels includes an emission unit that emits light to display an image.

In one embodiment, the emission unit may include a plurality of sub-pixels, each of which includes an organic light-emitting diode (OLED). In a full-color organic light-emitting display device, red (R red organic material), green (G green organic material) and blue (B blue organic material) sub-pixels are arranged in various patterns, such as for example, in a line, mosaic, or lattice pattern, to constitute a pixel. The organic light-emitting display device may include a monochromatic flat display device.

The circuit regions 40 control, for example, an image signal that is input to the pixel region 30. In some embodiments of the organic light-emitting display device, at least one thin film transistor (TFT) may be installed in each of the pixel region 30 and the circuit regions 40.

The at least one TFT installed in the pixel region 30 may include a pixel TFT, such as a switching TFT that transmits a data signal to an OLED according to a gate line signal to control the operation of the OLED, and a driving TFT that drives the OLED by supplying current according to the data signal. The at least one TFT installed in the circuit region 40 may include a circuit TFT constituted to implement a predetermined circuit.

Figure 2:
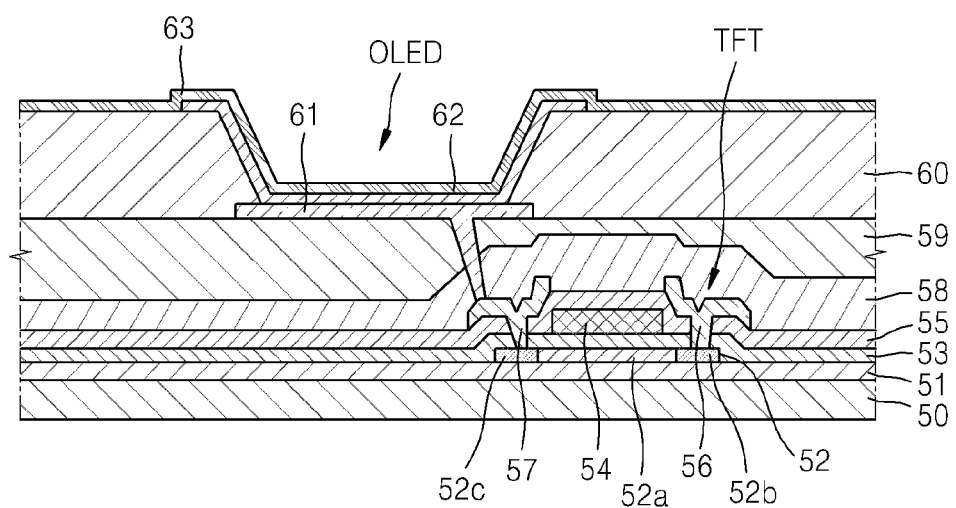
FIG. 2 is a cross-sectional view of a sub-pixel of the organic light-emitting display device illustrated in FIG. 1.

In various embodiments, the number and arrangement of TFTs may vary according to the features of the display device and the driving method thereof FIG. 2 is a cross-sectional view of a sub-pixel of the organic light-emitting display device illustrated in FIG. 1.

Referring to FIG. 2, a buffer layer 51 is formed on a substrate 50 formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52b and 52c, respectively, of the active layer 52 through contact holes. A passivation layer 58 is formed of $SiO_2$, $SiN_x$, or the like, on the source/drain electrodes 56 and 57. A planarization layer 59 is formed of an organic material, such as acryl, polyimide, benzocyclobutene (BCB), or the like, on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. Embodiments are not limited to the structure of the organic light-emitting display device described above, and various structures of organic light-emitting display devices may be applied.

The OLED displays predetermined image information by emitting red, green and blue light as current flows. The OLED includes the pixel electrode 61, which is connected to the drain electrode 56 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials include copper phthalocyanine (CuPc), N,N'-di(naphthalene-1-yl)-N,N'-diphenyl-benzidine (NPB), tris-8-hydroxyquinoline aluminum (Alq3), and the like. The low-molecular weight organic layer may be formed by vacuum deposition.

When a high-molecular weight organic layer is used as the organic layer 62, the organic layer 62 may have a structure including a HTL and an EML. In such embodiments, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. A transparent electrode may be formed of indium tin oxide (ITO), indium zinc oxide (IZO), zinc oxide (ZnO), or indium oxide ($In_2O_3$). A reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic emission layer 63.

In the organic light-emitting display device described above, the organic layer 62 including the emission layer may be formed by using a thin film deposition apparatus 100 of FIG. 3, which will be described later.

Hereinafter, an embodiment of a thin film deposition apparatus and a method of manufacturing an organic light-emitting display device by using the thin film deposition apparatus will be described in detail.

Figure 3:
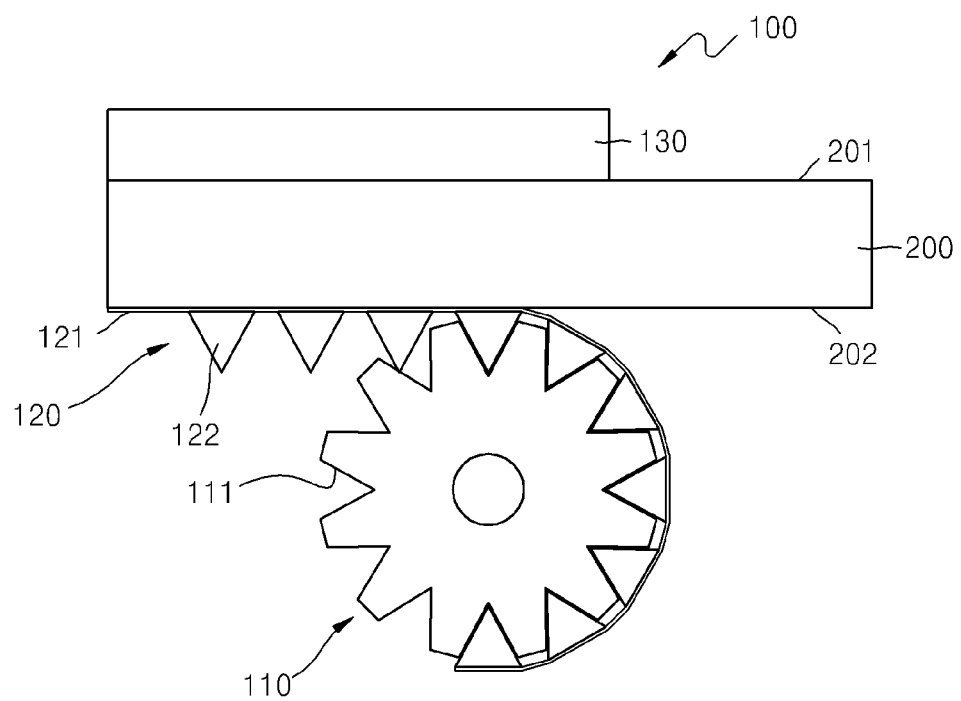
FIG. 3 is a schematic side view of an embodiment of a thin film deposition apparatus.
Figure 4:
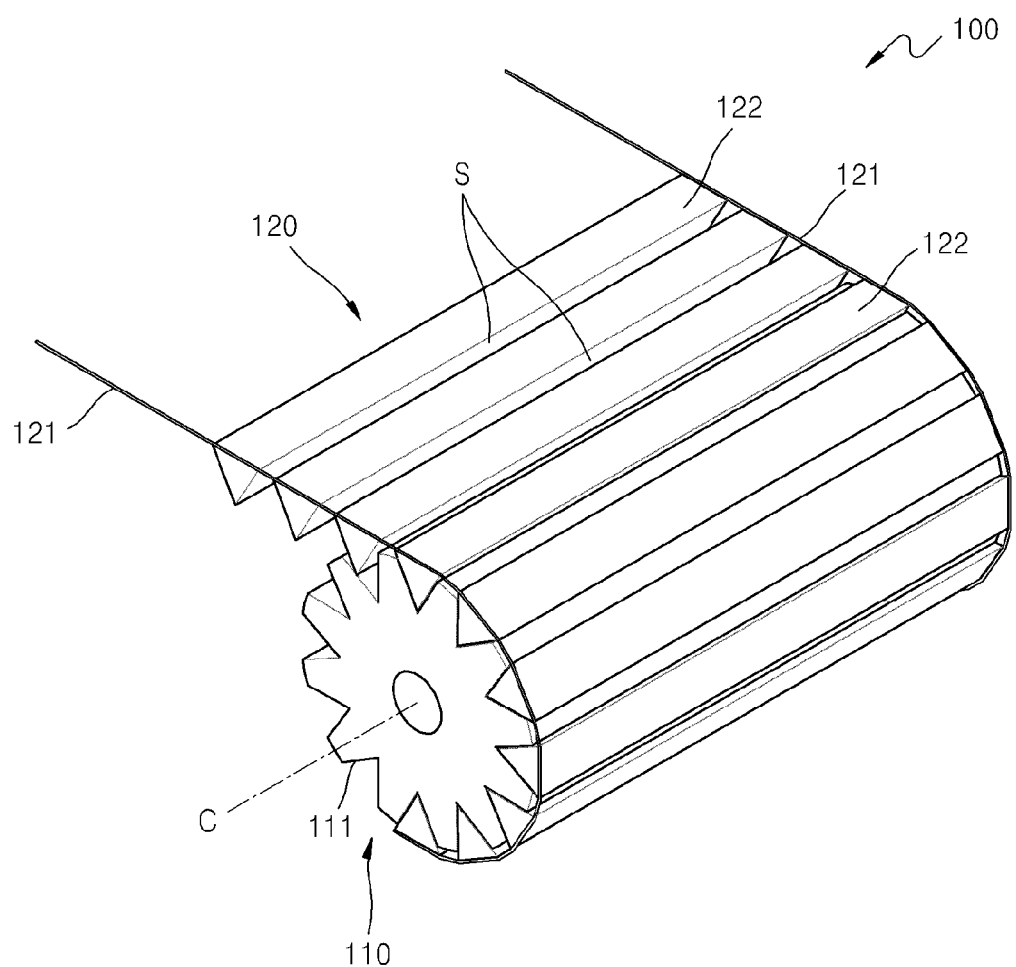
FIG. 4 is a schematic perspective view of a patterning wheel and a patterning wire of the thin film deposition apparatus of FIG. 3.

FIG. 3 is a schematic side view of an embodiment of a thin film deposition apparatus 100, and FIG. 4 is a schematic perspective view of a patterning wheel 110 and a patterning wire 120 of the thin film deposition apparatus 100 of FIG. 3.

Referring to FIGS. 3 and 4, the thin film deposition apparatus 100 includes the patterning wheel 110, the patterning wire 120, and a magnet 130. A chamber is not shown in FIGS. 3 and 4 for convenience of description, but the thin film deposition apparatus 100 may be disposed in a chamber maintaining a suitable vacuum level so as to obtain a rectilinear property of a deposition material.

The magnet 130 is disposed on a first surface 201 of a substrate 200, and the patterning wheel 110 and the patterning wire 120 are disposed at one side of a second surface 202 opposite to the first surface 201 of the substrate 200. Although not illustrated in FIGS. 3 and 4, a deposition source (not shown) for storing and heating a deposition material may be disposed at the side of the second surface 202, such as for example, below the patterning wheel 110. The deposition source may include a crucible filled with the deposition material therein, and a heater surrounding and heating the crucible. Accordingly, the deposition material vaporized in the deposition source passes through the patterning wire cohered to the second surface 202, and is deposited on the second surface 202. This is described in detail below.

The patterning wheel 110 can have a long cylindrical shape, and can be rotatable around a rotation axis C. A plurality of grooves 111 may be formed on a peripheral surface of the patterning wheel 110 along a direction of the rotation axis C.

In some embodiments, cross sections of the grooves 111 are equilateral triangular as shown in FIGS. 3 and 4. In other embodiments, the cross sections may be polygonal, such as, for example, rectangular or pentagonal, semicircular, or oval.

The patterning wire 120 may wound around the peripheral surface of the patterning wheel 110. The patterning wire 120 includes two frame wires 121 disposed in parallel, and a plurality of blockers 122 connecting the two parallel frame wires 121. In some embodiments, the blockers 122 are spaced apart from each other at regular intervals, and thus a predetermined patterning space S is formed between the neighboring blockers 122. The deposition material evaporated from the deposition source is deposited on the substrate 200 via the patterning wire 120, through the patterning space S. When the substrate 200 and the patterning wire 120 are adhered to each other, the deposition material is not deposited on a region where the blocker 122 is disposed, and is deposited on the patterning space S between the neighboring blockers 122. Accordingly, a width of a non-deposition region may be adjusted by adjusting a size of the blocker 122, and a width of a deposition region may be adjusted by adjusting an interval between the neighboring blockers 122.

In some embodiments, each blocker 122 may have a shape corresponding to each groove 111 formed on the peripheral surface of the patterning wheel 110, and thus may be accommodated in each groove 111. When the patterning wire 120 is wound around the patterning wheel 110, each blocker 122 is accommodated in each groove 111.

In some embodiments, cross sections of the blockers 122 are equilateral triangular, as shown in FIGS. 3 and 4. In other embodiments, the cross sections may be polygonal, such as, for example, rectangular or pentagonal, semicircular, or oval.

The patterning wheel 110 may include a magnet, such as a permanent magnet or electromagnet. The patterning wire 120 may include a magnetic substance. In some embodiments, the magnetic substance can be a material having magnetic properties, which adheres to the patterning wheel 110 including the magnet. Such a material may be copper (Co), platinum (Pt), iron (Fe), nickel (Ni), or lanthanum (La). The patterning wire 120 maintains a wound state around the patterning wheel 110 according to a magnetic force acting between the patterning wheel 110 and the patterning wire 120.

The magnet 130 may be disposed on the first surface 201 of the substrate 200. In some embodiments, the magnet 130 may be a permanent magnet or electromagnet. The patterning wire 120 may include the magnetic substance.

The patterning wire 120 may cohere on the second surface 202 of the substrate 200 according to the magnetic force acting between the magnet 130 and the patterning wire 120. In other embodiments, the patterning wire 120 may include a magnet and the magnet 130 may include a magnetic substance. In other embodiments, the patterning wire 120 and the magnet 130 may both include a magnet.

The patterning wire 120 wound around the patterning wheel 110 is unwound as the patterning wheel 110 rotates, and the unwound patterning wire 120 is cohered on the second surface 202 of the substrate 200 by the magnetic force acting between the patterning wire 120 and the magnet 130, thereby performing a mask function for depositing an organic material. When the patterning wire 120 is cohered on the second surface 202 of the substrate 200, the patterning space S between the neighboring blockers 122 performs a slit function of a mask.

In some embodiments, the magnet 130 may have a stronger magnetic force than the patterning wheel 110. The magnetic force acting between the magnet 130 and the patterning wire 120 may be stronger than the magnetic force acting between the patterning wheel 110 and the patterning wire 120. Accordingly, when the patterning wire 120 rotates while being wound around the patterning wheel 110, a part of the patterning wire near the magnet 130, for example, the blocker 122 of the patterning wire 120 near the substrate 200, is unwound from the patterning wheel 110 by the strong magnetic force of the magnet 130, and thus is tightly coupled on the second surface 202 of the substrate 200.

According to embodiments of the thin film deposition apparatus 100, the patterning wire 120 wound around the patterning wheel 110 is adhered to the substrate 200 to perform functions of a deposition mask, and thus a shadow is not generated on the substrate 200 since the substrate 200 and a mask, that is, the patterning wire 120 are tightly coupled together.

In a conventional fine metal mask (FMM) deposition method, a size of a mask is equal to or larger than a size of a substrate. Accordingly, as the size of the substrate increases, the size of the mask is also increased. However, it is difficult to manufacture a large mask, and to align the mask in a precise pattern by extending the mask. Also, the mask may droop due to its weight when the mask is large, and thus the drooping portion of the mask may not adhere to the substrate, thereby generating a shadow on the substrate.

Accordingly, a method of performing deposition while moving a deposition source and a mask with respect to a substrate, by using a mask smaller than a conventional FMM has been developed. In order for the mask to move with respect to the substrate, the mask and the substrate need to be somewhat spaced apart from each other. However, when the mask and the substrate are spaced apart from each other a shadow is generated on the substrate, and color mixture is generated due to a space between the mask and the substrate.

Accordingly, embodiments of the thin film deposition apparatus 100 use the patterning wire 120 that performs mask functions by using a wire much lighter than a conventional FFM. Thus, a mask that is easily adhered to a wide area, and is freely detached if required is manufactured. The thin film deposition apparatus 100 may be easily manufactured, may be easily applied to manufacture large-sized display devices on a mass scale, and improves manufacturing yield and deposition efficiency. Also, it is relatively easy to clean a mask since the mask is freely detached.

Embodiments for a method of manufacturing an organic light-emitting display device by using a thin film deposition apparatus are described in detail below.

Figure 5:
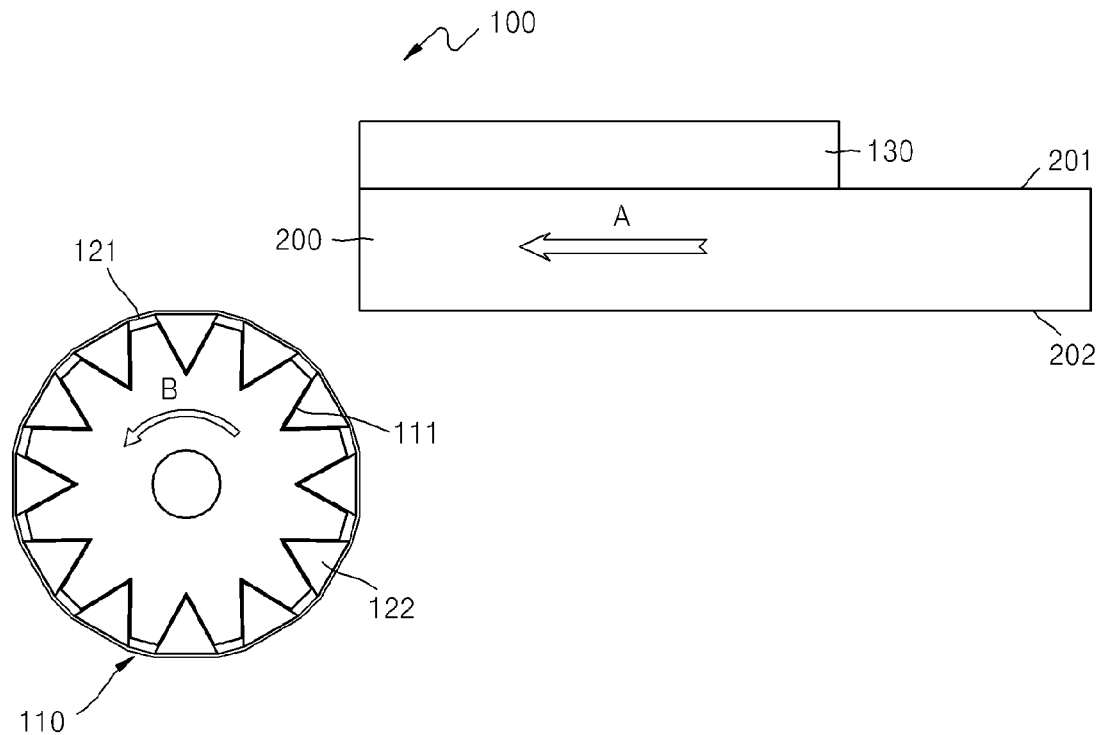
FIGS. 5 through 7 are views for describing an embodiment of a method of manufacturing an organic light-emitting display device by using the thin film deposition apparatus of FIG. 3.
Figure 6:
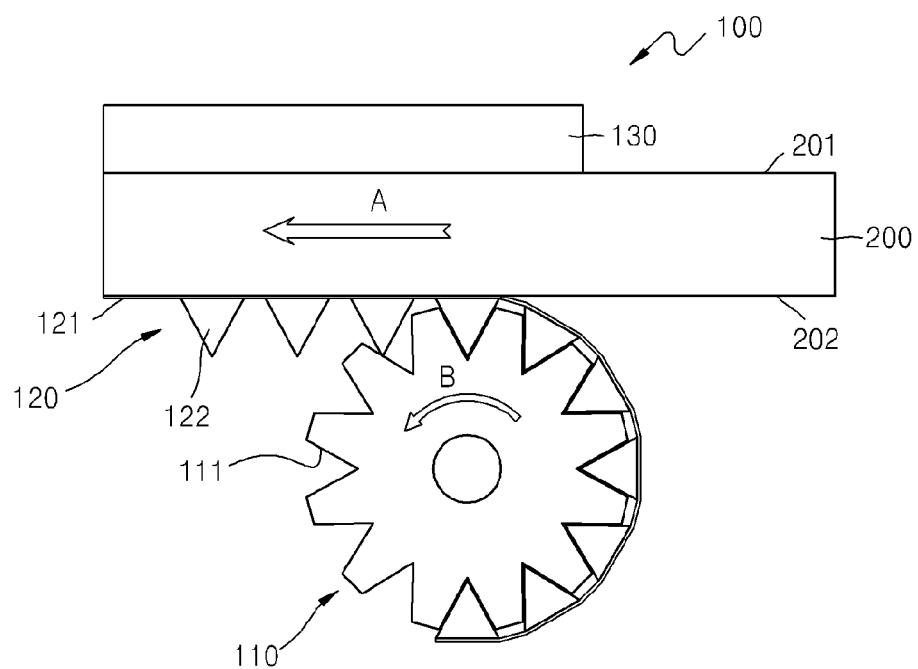
Figure 7:
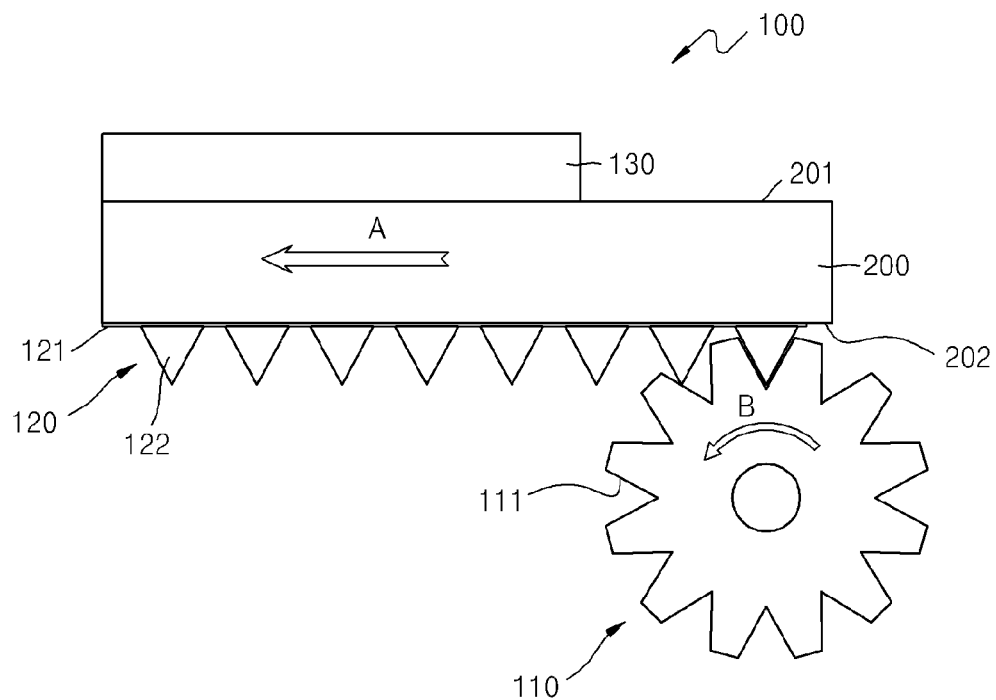

FIGS. 5 through 7 are views for describing an embodiment of a method of manufacturing an organic light-emitting display device by using the thin film deposition apparatus 100 of FIG. 3. In one embodiment, the patterning wheel 110 rotates in a direction indicated by an arrow B around the rotation axis C of FIG. 4 while a location of the patterning wheel 110 is fixed, and the substrate 200 only moves rectilinearly in a direction indicated by an arrow A.

As shown in FIG. 5, the patterning wire 120 is completely wound around a peripheral surface of the patterning wheel 110. The plurality of grooves 111 are formed on the peripheral surface of the patterning wheel 110 along the direction of the rotation axis C, and the patterning wire 120 includes the blockers 122 having the shapes corresponding to the grooves 111. Thus, each blocker 122 is accommodated in each groove 111. In some embodiments, the patterning wheel 110 may include a magnet, such as a permanent magnet or an electromagnet, and the patterning wire 120 may include a magnetic substance. Accordingly, the patterning wire 120 maintains a wound state around the patterning wheel 110 according to the magnetic force acting between the magnetic wheel 110 and the patterning wire.

As shown in FIG. 6, the substrate 200 is rectilinearly moved in the direction of the arrow A while the patterning wheel 110 rotates around the rotation axis C in the direction of the arrow B. In some embodiments, a speed of the substrate 200 rectilinearly moving and a speed of the patterning wheel 110 rotating may be identical. A moving distance per unit hour of the substrate 200 may be identical to a rotation distance per unit hour of the patterning wheel 110.

In some embodiments, the magnet 130 is disposed on the first surface 201 of the substrate 200, and the magnet 130 includes a permanent magnet or an electromagnet. Also, the magnet 130 may have a stronger magnetic force than the patterning wheel 110.

Accordingly, when the substrate 200 rectilinearly moves and passes the patterning wire 120 that is wound around the patterning wheel 110, a part of the patterning wire 120 near the magnet 130, that is, the blocker 122 of the patterning wire 120 near the substrate 200, is unwound from the patterning wheel 110 and tightly coupled on the second surface 202 of the substrate 200 by the strong magnetic force of the magnet 130.

As shown in FIG. 7, when the substrate 200 completely passes through the patterning wheel 110, the patterning wire 120 wound around the patterning wheel 110 is all tightly coupled to the substrate 200, thereby performing functions of a mask for organic material deposition. In other words, when the substrate 200 and the patterning wire 120 are adhered to each other, a deposition material is not deposited in a region where the blocker 122 is disposed, and the patterning space S between the neighboring blockers 122 performs functions of a slit of the mask. Accordingly, the deposition material is deposited on the substrate 200 below the patterning space S.

Figure 8:
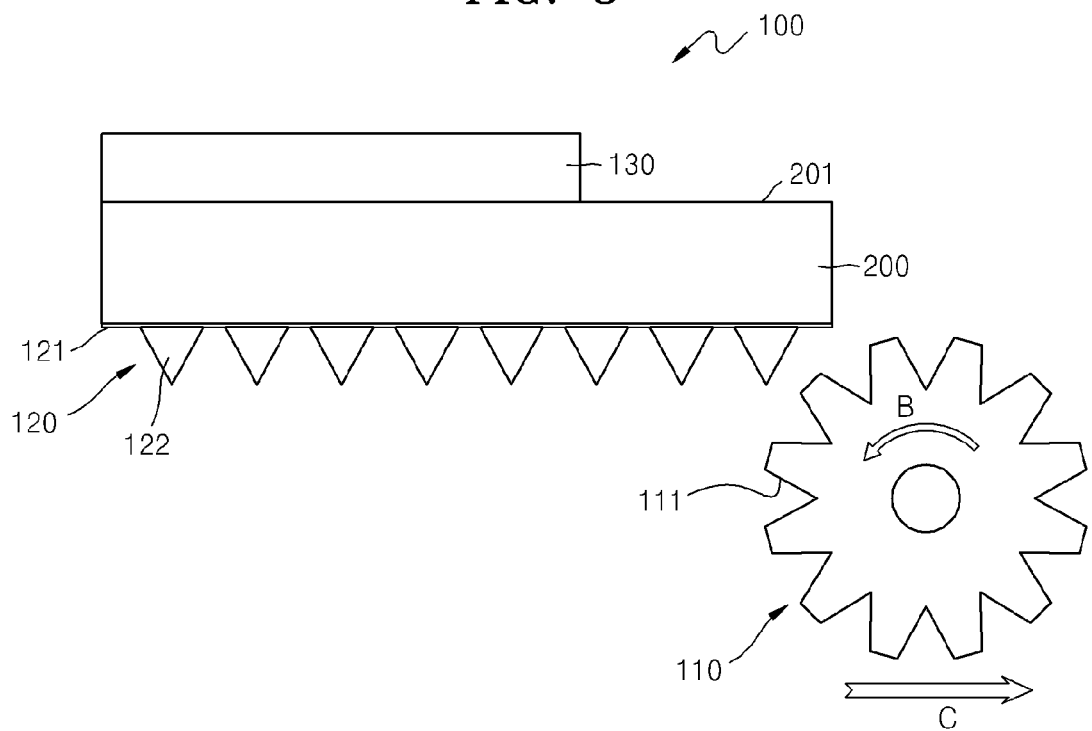
FIG. 8 is a view for describing another embodiment of a method of manufacturing an organic light-emitting display device by using the thin film deposition apparatus of FIG. 3.

In the embodiment of FIGS. 5 through 7, the substrate 200 rectilinearly moves while the location of the patterning wheel 110 is fixed. In other embodiments, such as the one shown in FIG. 8, the substrate 200 may be fixed, and the patterning wheel 110 may rotate in the direction indicated by the arrow B while rectilinearly moving in a direction indicated by an arrow C, thereby tightly coupling the substrate 200 and the patterning wire 120 wound around the patterning wheel 110.

Figure 9:
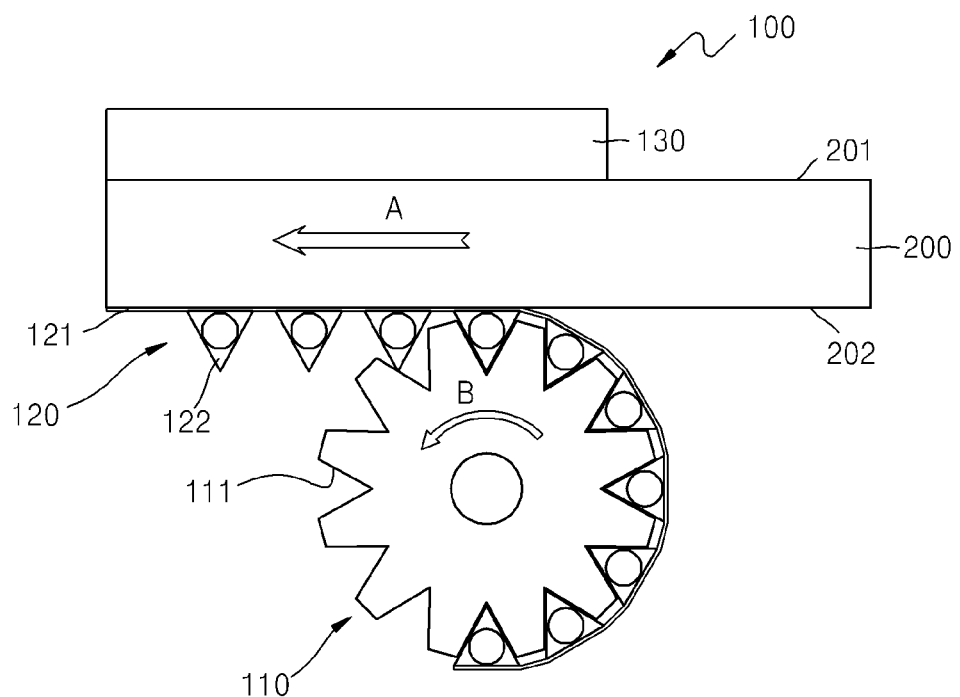
FIG. 9 is a schematic side view of another embodiment of a thin film deposition apparatus.

FIG. 9 is a schematic side view of another embodiment of a thin film deposition apparatus 100. Referring to FIG. 9, the thin film deposition apparatus 100 includes the patterning wheel 110, the patterning wire 120, and the magnet 130.

The embodiment of the thin film deposition apparatus 100 of FIG. 9 is different from that of the previous embodiment as only a part of the patterning wire 120 includes a magnetic substance instead of the entire patterning wire 120.

The patterning wire 120 includes the two frame wires 121 disposed parallel to each other, the plurality of blockers 122 connecting the two frame wires 121 parallel to each other, and a core 123 accommodated in each blocker 122. Here, the blocker 122 is formed of any light and strong material, such as plastic or rubber, and only the core 123 includes a magnetic substance, such as Co, Pt, Fe, Ni, or La. Accordingly, the patterning wire 120 that is light, strong, and unexpensive may be prepared.

Figure 10:
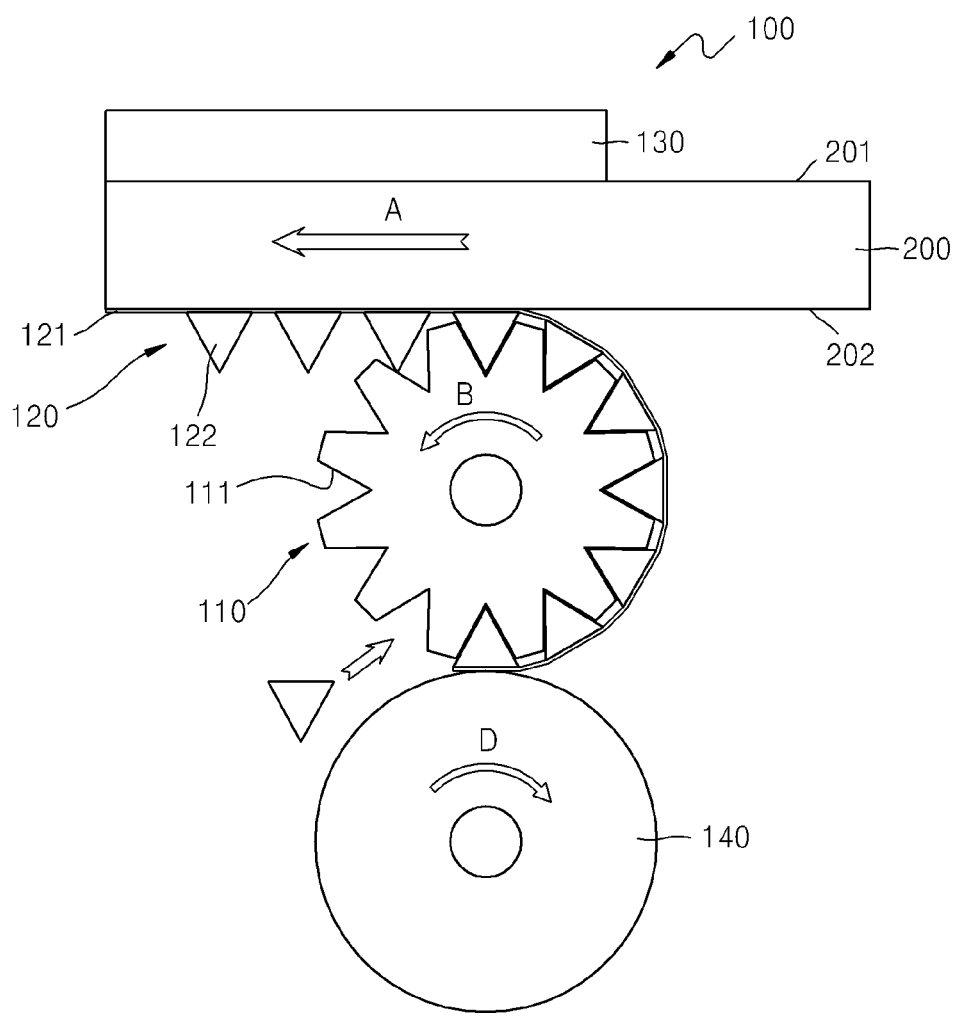
FIG. 10 is a schematic side view of another embodiment of a thin film deposition apparatus.

FIG. 10 is a schematic side view of another embodiment of the thin film deposition apparatus 100. Referring to FIG. 10, the thin film deposition apparatus 100 includes the patterning wheel 110, the patterning wire 120, the magnet 130, and a pressurizer 140. The thin film deposition apparatus 100 of FIG. 10 is different from those of the previous embodiments in that the thin film deposition apparatus 100 further includes the pressurizer 140.

The pressurizer 140 may be disposed at one side of the patterning wheel 110, such as for example, at a side opposite to the substrate 200. The pressurizer 140 is rotatable in a direction indicated by an arrow D of FIG. 10, and pressurizes the blocker 122 of the patterning wire 120 toward the patterning wheel 110, thereby supporting the patterning wire 120 to be well fit to the patterning wheel 110. Accordingly, operation reliability of the thin film deposition apparatus 100 may be increased.

Figure 11:
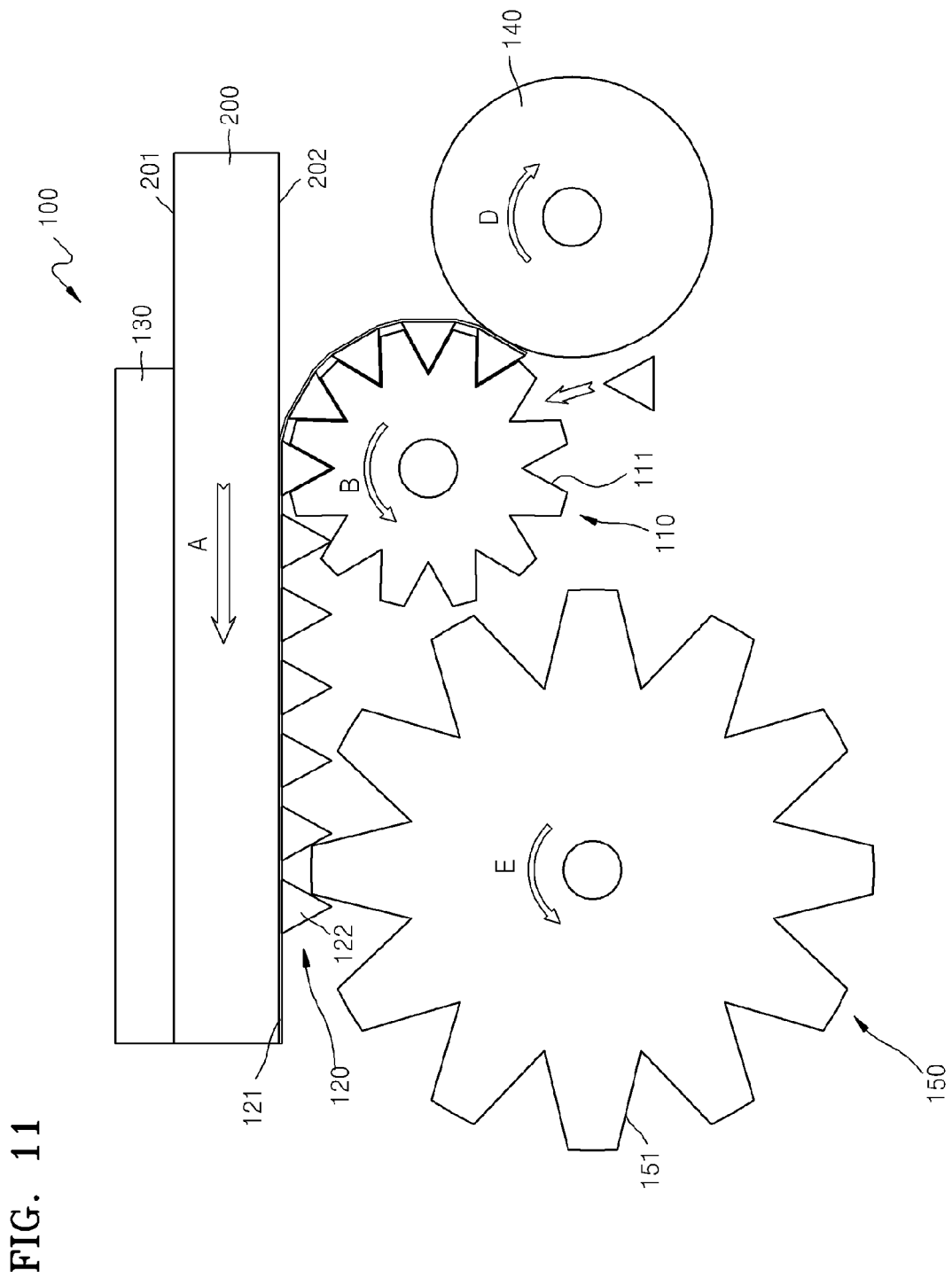
FIG. 11 is a schematic side view of another embodiment of a thin film deposition apparatus.

FIG. 11 is a schematic side view of another embodiment of the thin film deposition apparatus 100. Referring to FIG. 11, the thin film deposition apparatus 100 includes the patterning wheel 110, the patterning wire 120, the magnet 130, the pressurizer 140, and an alignment wheel 150. The thin film deposition apparatus 100 of FIG. 11 is different from those of the previous embodiments as the alignment wheel 150 is further included.

The alignment wheel 150 has a long cylindrical shape, and may be rotatable in a direction indicated by an arrow E around a rotation axis. A plurality of protrusions 151 may be formed on a peripheral surface of the alignment wheel 150 along a direction of the rotation axis. The alignment wheel 150 may be disposed at one side of the patterning wheel 110, in a direction that the substrate 200 moves on the patterning wheel 110 (to the left in FIG. 11). Also, locations of the blockers 122 of the patterning wire 120 combined to the substrate 200 are aligned by the protrusions 151 rotating in the direction indicated by the arrow E around the rotation axis. The alignment wheel 150 pressurizes the blockers 122 of the patterning wire 120 tightly coupled to the substrate 200 to align the locations of the blockers 122, so as to prepare for when a location the patterning wire 120 wound around the patterning wheel 110 is deviated while tightly coupling the patterning wire 120 to the substrate 200. Accordingly, the operation reliability of the thin film deposition apparatus 100 may be further improved.

Figure 12:
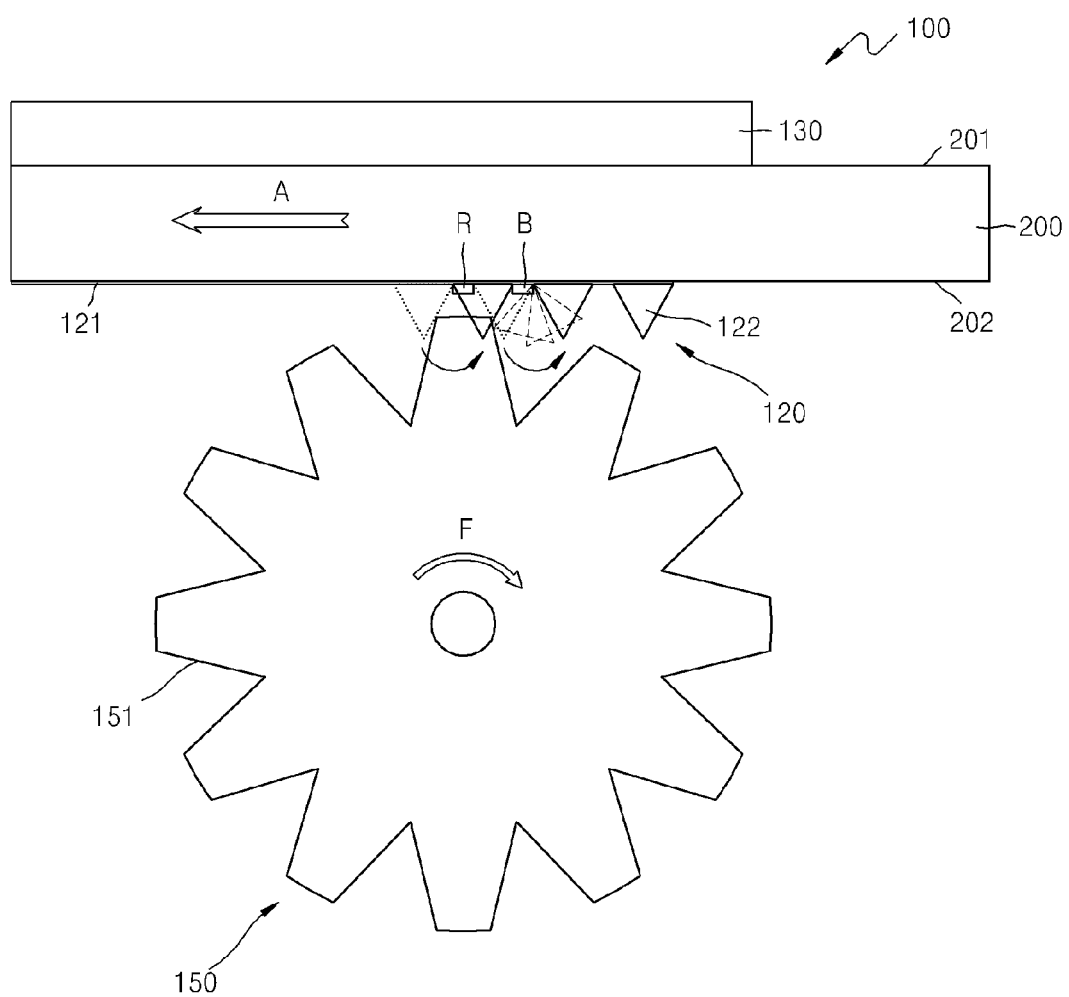
FIG. 12 is a schematic side view for describing another embodiment of a method of manufacturing an organic light-emitting display device by using a thin film deposition apparatus.

FIG. 12 is a schematic side view for describing another embodiment of a method of manufacturing an organic light-emitting display device by using the thin film deposition apparatus 100. Referring to FIG. 12, the thin film deposition apparatus 100 includes a patterning wheel (not shown), the patterning wire 120, the magnet 130, and the alignment wheel 150. In one embodiment, the patterning wire 120, on which a layer of organic material is deposited, is moved by a certain amount by using the alignment wheel 150, so that another layer of organic material may be continuously deposited.

In detail, as shown in FIGS. 1 and 2, the red, green, and blue sub-pixels are alternatively formed in the organic light-emitting display device. Accordingly, a red organic material, a green organic material, and a blue organic material are alternatively deposited in the sub-pixels. Accordingly, three different FM:Ms are conventionally used. An FMM for depositing a red organic material is adhered to a substrate to deposit the red organic material and then separated from the substrate. An FMM for depositing a green organic material is adhered to the substrate to deposit the green organic material and then separated from the substrate. An FMM for depositing a blue organic material is adhered to the substrate to deposit the blue organic material and then separated from the substrate.

Accordingly, embodiments of the method continuously manufacture the organic light-emitting display device without having to replace a mask by moving the patterning wire 120, on which one layer of organic material is deposited, is moved by a certain amount by using the alignment wheel 150.

After the patterning wire 120 and the substrate 200 are tightly coupled, a red organic material R is deposited while the blockers 122 are disposed in a region disposed by dotted lines in FIG. 12. When the red organic material R is deposited as such, the alignment wheel 150 is rotated in a direction indicated by an arrow F of FIG. 12, so as to move the patterning wire 120 tightly coupled to the substrate 200 by a certain amount. In some embodiments, a moving amount of the patterning wire 120 may be ⅓ of a width of one blocker 122. This is because a red organic material is deposited on ⅓ of the entire area, a blue organic material is deposited on another ⅓, and a green organic material is deposited on a remaining ⅓. After moving the patterning wire 120 tightly coupled to the substrate 200 by the certain amount, a blue organic material B is deposited while the blocker 122 is disposed on a region indicated by a solid line in FIG. 12. Then, the patterning wire 120 may be moved again by ⅓ of the width of the blocker 122 to deposit a green organic material G.

Without having to use three different FM:Ms so as to deposit red, green, and blue organic materials, the red, green, and blue organic materials are deposited by moving one patterning wire 120 by a certain amount. Accordingly, a manufacturing time of the organic light-emitting display device is remarkably reduced.

According to embodiments of the thin film deposition apparatus and the method of manufacturing the organic light-emitting display device by using the thin film deposition apparatus of the present invention, the thin film deposition apparatus can be easily manufactured, can be easily applied to manufacture large-sized display devices on a mass scale, and can improve manufacturing yield and deposition efficiency.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A thin film deposition apparatus for forming a thin film on a substrate, the thin film deposition apparatus comprising:
    a magnet disposed on a first surface of the substrate;
    a patterning wheel disposed on a second surface opposite to the first surface of the substrate, rotatable around a rotation axis, the patterning wheel comprising a permanent magnet, and a plurality of grooves along a peripheral surface; and
    a patterning wire comprising a plurality of blockers having shapes corresponding to the plurality of grooves of the patterning wheel, the patterning wire configured to maintain a wound state around the patterning wheel by a magnetic force created by the permanent magnet.

2. The thin film deposition apparatus of claim 1, wherein the patterning wire comprises two frame wires disposed to face each other, and wherein the plurality of blockers connect the two frame wires.

3. The thin film deposition apparatus of claim 1, wherein a predetermined patterning space is formed between neighboring blockers of the plurality of blockers, while the patterning wire is tightly coupled to the substrate.

4. The thin film deposition apparatus of claim 3, wherein a deposition material is deposited on the second surface of the substrate through the predetermined patterning space.

5. The thin film deposition apparatus of claim 1, wherein the plurality of grooves and the plurality of blockers have substantially the same shape and are disposed at regular intervals.

6. The thin film deposition apparatus of claim 5, wherein each of the plurality of blockers is accommodated in each of the plurality of grooves while the patterning wire maintains a wound state around the patterning wheel.

7. The thin film deposition apparatus of claim 1, wherein an interval between neighboring grooves of the plurality of grooves, and an interval between neighboring blockers of the plurality of blockers are substantially the same.

8. The thin film deposition apparatus of claim 1, wherein cross sections of the plurality of grooves and of the plurality of blockers are triangular.

9. The thin film deposition apparatus of claim 1, wherein the patterning wire comprises a magnetic substance, and wherein the patterning wire is configured to be tightly coupled to the second surface of the substrate by a magnetic force acting between the magnetic substance and the patterning wire.

10. The thin film deposition apparatus of claim 9, wherein the magnetic substance comprises at least one of copper (Co), platinum (Pt), iron (Fe), nickel (Ni), and lanthanum (La).

11. The thin film deposition apparatus of claim 9, wherein the magnetic substance is formed to have a magnetic force stronger than the patterning wheel.

12. The thin film deposition apparatus of claim 1, wherein the patterning wheel comprises an electromagnet, and the patterning wire is configured to maintain a wound state around the patterning wheel by a magnetic force acting between the patterning wheel and the patterning wire.

13. The thin film deposition apparatus of claim 1, wherein the patterning wire is accommodated in the plurality of blockers, and further comprises a core comprising a magnetic substance.

14. The thin film deposition apparatus of claim 1, further comprising a pressurizer disposed on the patterning wheel at a side opposite to the substrate, having a roller shape, and pressurizing each of the plurality of blockers so that each of the plurality of blockers is matched to each of the plurality of grooves.

15. The thin film deposition apparatus of claim 1, further comprising a rotatable alignment wheel of a cylindrical shape, comprising a plurality of protrusions along a peripheral surface of the alignment wheel, disposed at one side of the patterning wheel, and pressurizing the plurality of blockers so that a location of the patterning wire tightly coupled to the substrate is aligned.

16. The thin film deposition apparatus of claim 1, wherein the patterning wire is further configured to be unwound from the patterning wheel and tightly coupled to the substrate to form a mask for deposition.

17. The thin film deposition apparatus of claim 1, wherein the patterning wire is configured to be unwound and tightly coupled to the substrate as the substrate relatively moves with respect to the patterning wheel and the patterning wheel rotates based on the rotation axis.

* * * * *

UNITED STATES PATENT AND TRADEMARK OFFICE
CERTIFICATE OF CORRECTION

| | | |
|---|---|---|
| PATENT NO. | : 8,920,563 B2 | Page 1 of 1 |
| APPLICATION NO. | : 13/225992 | |
| DATED | : December 30, 2014 | |
| INVENTOR(S) | : Mu-Gyeom Kim et al. | |

It is certified that error appears in the above-identified patent and that said Letters Patent is hereby corrected as shown below:

In the Specification

At column 4, line 45, delete "thereof" and insert --thereof.--, therefor.

At column 10, line 26, delete "FM:Ms" and insert --FMMs--, therefor.

At column 10, line 58, delete "FM:Ms" and insert --FMMs--, therefor.

Signed and Sealed this
First Day of September, 2015

Michelle K. Lee
*Director of the United States Patent and Trademark Office*